(12) United States Patent
Miller et al.

(10) Patent No.: US 7,741,175 B2
(45) Date of Patent: *Jun. 22, 2010

(54) METHODS OF FORMING CAPACITORS

(75) Inventors: Matthew W. Miller, Meridian, ID (US); Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 81 days.

This patent is subject to a terminal disclaimer.

(21) Appl. No.: 11/954,913

(22) Filed: Dec. 12, 2007

(65) Prior Publication Data
US 2008/0268591 A1    Oct. 30, 2008

Related U.S. Application Data

(60) Continuation of application No. 11/206,334, filed on Aug. 17, 2005, now Pat. No. 7,329,573, which is a division of application No. 10/695,959, filed on Oct. 27, 2003, now Pat. No. 7,374,993.

(51) Int. Cl.
*H01L 21/8242* (2006.01)

(52) U.S. Cl. .............................. 438/251; 257/E21.008

(58) Field of Classification Search .......... 257/E21.008, 257/E21.021; 438/239, 250–253, 622, 393
See application file for complete search history.

(56) References Cited

U.S. PATENT DOCUMENTS

| 5,452,178 | A | 9/1995 | Emesh et al. | |
|---|---|---|---|---|
| 6,399,522 | B1 | 6/2002 | Tsan et al. | |
| 6,475,854 | B2 | 11/2002 | Narwankar et al. | |
| 6,605,530 | B2 | 8/2003 | Nakamura et al. | |
| 6,737,313 | B1* | 5/2004 | Marsh et al. | 438/240 |
| 6,784,478 | B2 | 8/2004 | Merchant et al. | |
| 6,853,540 | B2 | 2/2005 | Kudoh et al. | |
| 7,172,946 | B2 | 2/2007 | Choi et al. | |
| 7,329,573 | B2* | 2/2008 | Miller et al. | 438/251 |
| 7,374,993 | B2* | 5/2008 | Miller et al. | 438/239 |
| 2002/0098646 | A1 | 7/2002 | Hirano et al. | |

\* cited by examiner

*Primary Examiner*—Hoa B Trinh
(74) *Attorney, Agent, or Firm*—Wells St. John P.S.

(57) ABSTRACT

A method of forming a capacitor includes forming a first capacitor electrode over a semiconductor substrate. A capacitor dielectric region is formed onto the first capacitor electrode. The capacitor dielectric region has an exposed oxide containing surface. The exposed oxide containing surface of the capacitor dielectric region is treated with at least one of a borane or a silane. A second capacitor electrode is deposited over the treated oxide containing surface. The second capacitor electrode has an inner metal surface contacting against the treated oxide containing surface. Other aspects and implementations are contemplated.

24 Claims, 3 Drawing Sheets

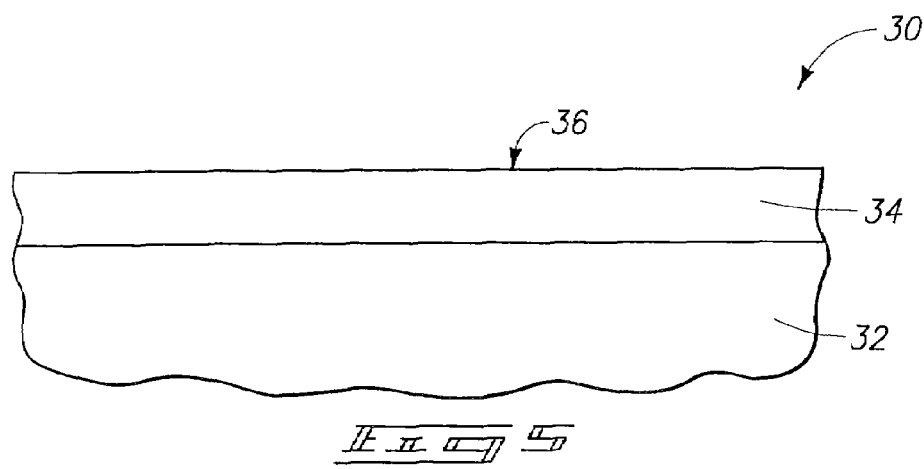
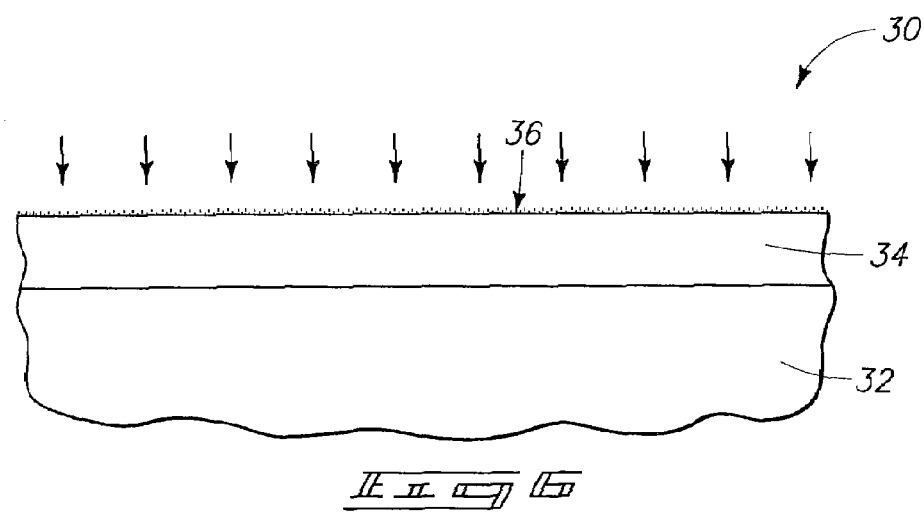
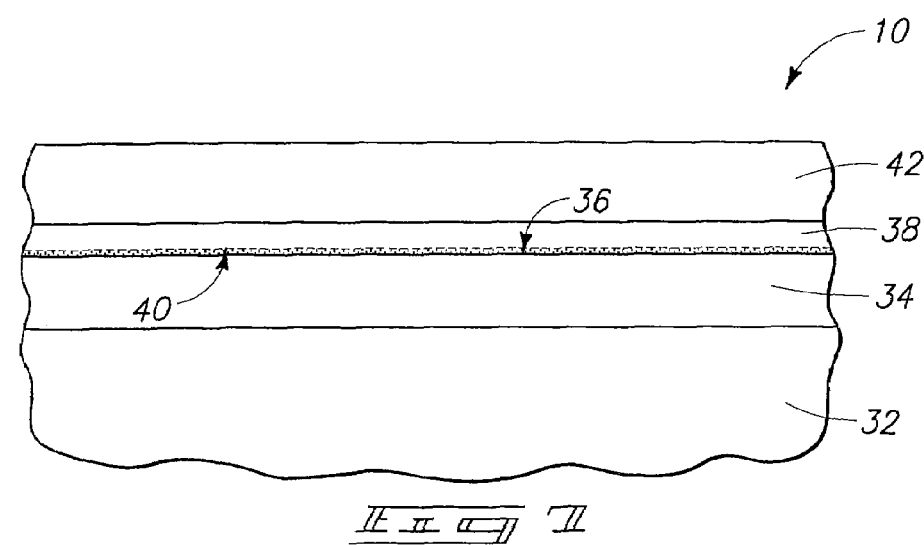

_US 7,741,175 B2_

METHODS OF FORMING CAPACITORS

RELATED PATENT DATA

This application is a continuation of U.S. patent application Ser. No. 11/206,334, filed Aug. 17, 2005, entitled "Methods of Forming Capacitors", naming Matthew W. Miller and Cem Basceri as inventors, which was a divisional application of U.S. patent application Ser. No. 10/695,959, filed Oct. 27, 2003, entitled "Methods of Forming Capacitors", naming Matthew W. Miller and Cem Basceri as inventors, the disclosures of which are incorporated herein by reference.

TECHNICAL FIELD

This invention relates to methods of forming capacitors.

BACKGROUND OF THE INVENTION

Capacitors are commonly-used electrical components in semiconductor circuitry, for example memory circuitry such as DRAM circuitry. A typical capacitor is comprised of two conductive electrodes separated by a non-conducting capacitor dielectric region. As integrated circuit density increases, there is a continuing challenge to maintain sufficiently high storage capacitance despite decreasing capacitor area. One way of increasing cell capacitance is through cell structure techniques. Such techniques include three-dimensional cell capacitors, such as trenched and stacked capacitors. Other ways of increasing cell capacitance include the development and utilization of new materials for one or both of the electrodes and the capacitor dielectric region.

One type of capacitor utilizes a semiconductor-insulator-semiconductor (SIS) construction. Capacitance increase can result for the same capacitor dielectric region by making one or both of the electrodes metallic, for example forming semiconductor-insulator-metal (SIM), metal-insulator-semiconductor (MIS) or metal-insulator-metal (MIM) capacitors. However, capacitance increase from such constructions can also cause increased undesired leakage current across the capacitor. Further, the deposition of oxide containing capacitor dielectric regions, as well as deposition of certain metal containing capacitor electrode materials, can be problematic in the fabrication of metal containing capacitor electrodes.

While the invention was motivated in addressing the above described issues, it is in no way so limited. The invention is only limited by the accompanying claims as literally worded, without interpretative or other limiting reference to the specification, and in accordance with the doctrine of equivalents.

SUMMARY

The invention includes methods of forming capacitors. In one implementation, a method of forming a capacitor includes forming a first capacitor electrode over a semiconductor substrate. A capacitor dielectric region is formed onto the first capacitor electrode. The capacitor dielectric region has an exposed oxide containing surface. The exposed oxide containing surface of the capacitor dielectric region is treated with at least one of a borane or a silane. A second capacitor electrode is deposited over the treated oxide containing surface. The second capacitor electrode has an inner metal surface contacting against the treated oxide containing surface.

In one implementation, a method of forming a capacitor includes forming a first capacitor electrode over a semiconductor substrate. The first capacitor electrode has an exposed metal surface. The exposed metal surface of the first capacitor electrode is treated with at least one of a borane or a silane. A capacitor dielectric region is formed onto the first capacitor electrode. The capacitor dielectric region has an oxide containing surface received contacting against the treated metal surface of the first capacitor electrode. A second capacitor electrode is formed over the capacitor dielectric region.

Other aspects and implementations are contemplated.

BRIEF DESCRIPTION OF THE DRAWINGS

Preferred embodiments of the invention are described below with reference to the following accompanying drawings.

FIG. 5 is a diagrammatic sectional view of an alternate embodiment semiconductor wafer fragment in process in accordance with an aspect of the invention.

FIG. 6 is a view of the FIG. 5 fragment at a processing step subsequent to that shown by FIG. 5.

FIG. 7 is a view of the FIG. 5 fragment at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
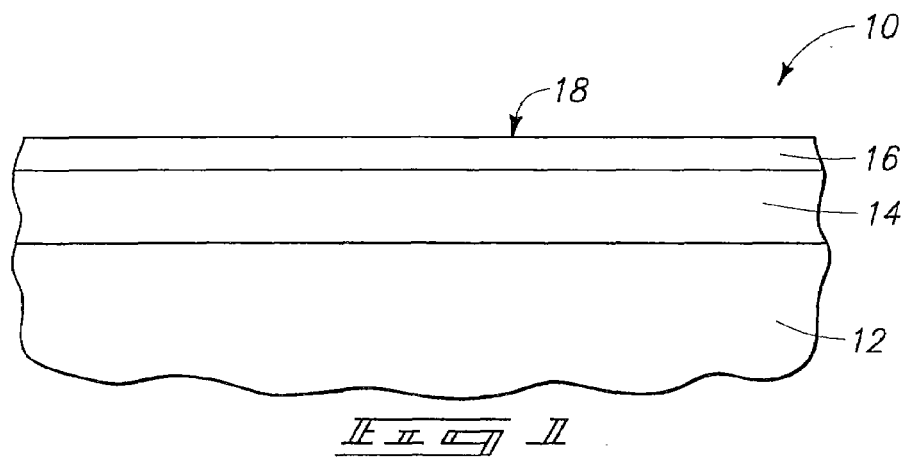
FIG. 1 is a diagrammatic sectional view of a semiconductor wafer fragment in process in accordance with an aspect of the invention.

An exemplary preferred first embodiment method of forming a capacitor is described with reference to FIGS. 1-3. FIG. 1 depicts a substrate fragment 10, for example a semiconductor substrate fragment, comprising some semiconductor substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, substrate 12 comprises some semiconductive material, and additionally may include insulative and/or conductive materials in various regions and/or layers. Also in the context of this document, the term "metal" is defined as any one or combination of a conductive elemental metal, a conductive alloy of elemental metals, or a conductive metal compound.

A first capacitor electrode 14 is formed over semiconductor substrate 12. Such might be patterned in a finished first capacitor electrode shape and construction or, more likely, might be subsequently patterned or processed to provide a desired finished shape and construction. First capacitor electrode 14 might comprise semiconductive material (i.e., polysilicon or monocrystalline silicon) or metal. Further, first capacitor electrode 14 might comprise a combination of such materials and/or discrete layers of different conductive and semiconductive materials. In one exemplary preferred embodiment, first capacitor electrode 14 consists essentially of semiconductive material. In another exemplary preferred embodiment, first capacitor electrode 14 consists essentially of metal. By way of example only, exemplary materials include conductive nitrides and conductive carbides. Specific examples, and by way of example only, include titanium nitride, tungsten, tungsten nitride, tantalum, tantalum nitride, copper, titanium silicon nitride, titanium boron nitride, tungsten nitrogen carbide, titanium carbide and tantalum carbide, just to name a few.

A capacitor dielectric region 16 is formed onto first capacitor electrode 14. Such might comprise a plurality of different capacitor dielectric materials and/or layers. For example, such might comprise a mixture or layer(s) of exemplary materials such as hafnium oxide, aluminum oxide, silicon oxide, silicon nitride and/or any other capacitor dielectric material whether existing or yet-to-be developed. Regardless, capacitor dielectric region 16 comprises an exposed oxide containing surface 18. Surface 18 might encompass the entirety of the exposed outer surface of capacitor dielectric region 16, or discrete or continuous sub-portions thereof. In one exemplary embodiment, exposed oxide containing surface 18 comprises one or both of hafnium oxide and aluminum oxide.

Figure 2:
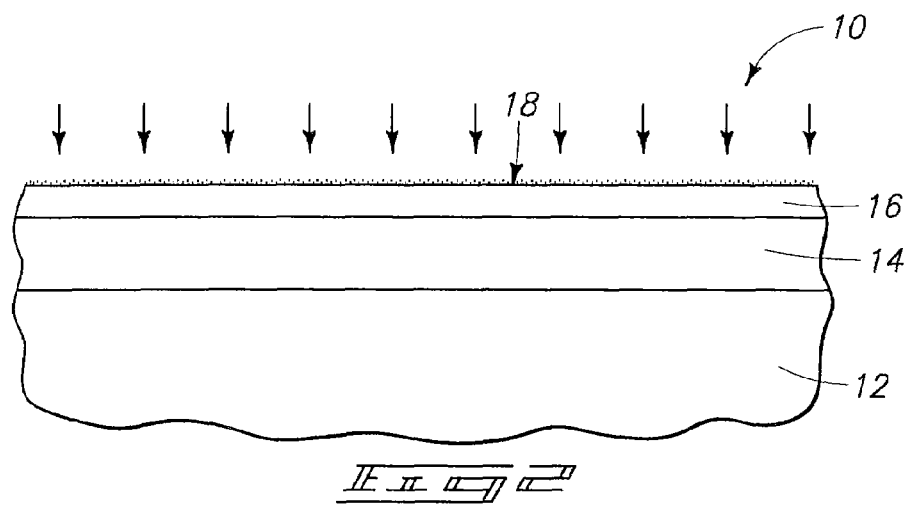
FIG. 2 is a view of the FIG. 1 fragment at a processing step subsequent to that shown by FIG. 1.

Referring to FIG. 2, exposed oxide containing surface 18 of capacitor dielectric region 16 is treated with at least one of a borane or a silane (including, of course, treatment with both). Most preferably, any and all boranes and silanes that are utilized during the treating are void of any halogen. Exemplary preferred boranes include $BH_3$, $B_2H_6$, $B_4H_{10}$, $B_5H_9$, $B_6H_{10}$, $B_{10}H_{14}$, and mixtures thereof. Exemplary preferred silanes include $SiH_4$, $Si_2H_6$, $Si_3H_8$, $Si_4H_{10}$, and mixtures thereof. An exemplary preferred substrate ambient temperature during the treating is from 200° C. to 500° C. An exemplary preferred pressure range over the substrate during the treating is from 1 Torr to 100 Torr. By way of example only, an exemplary flow rate of the borane and/or silane, and any other gases included with such treating gases, is from 10 sccm to 1000 sccm in an exemplary six liter reactor. The time of treating is preferably for at least one second, and more preferably and likely for at least ten seconds, and perhaps dependent upon a desired result or advantage to be achieved. A specific example in a six liter reactor includes 350° C., 5 Torr, $SiH_4$ (or borane flow) at 10 sccm, inert gas flow (i.e., Ar) at 1000 sccm and for 30 seconds.

Treating in the exemplary manners described can produce certain results and advantages during the fabrication of the capacitor and/or in the resultant capacitor produced. However, such results or advantages are not considered as limiting aspects of the invention unless literally appearing in an accompanying claim under analysis. Further, additional results, advantages or attributes might be imparted by the treating, which are not presently recognized and/or might be discovered later. Exemplary known results and advantages are described below. Regardless, the physical and/or chemical effect of the treating may result in the deposition of some layer or may not result in the deposition of any layer (i.e., no layer might be deposited by the treating). Most preferably if any layer is deposited by the treating, such is no more than three monolayers thick, with the most preferred aspect of the invention thereby not encompassing the deposition of any significantly thick layer over capacitor dielectric region 16. FIG. 2 depicts exemplary treating merely diagrammatically exemplified by the downwardly depicted arrows, with stippling of/over outer surface 18 being depicted as a treatment thereof.

Figure 3:
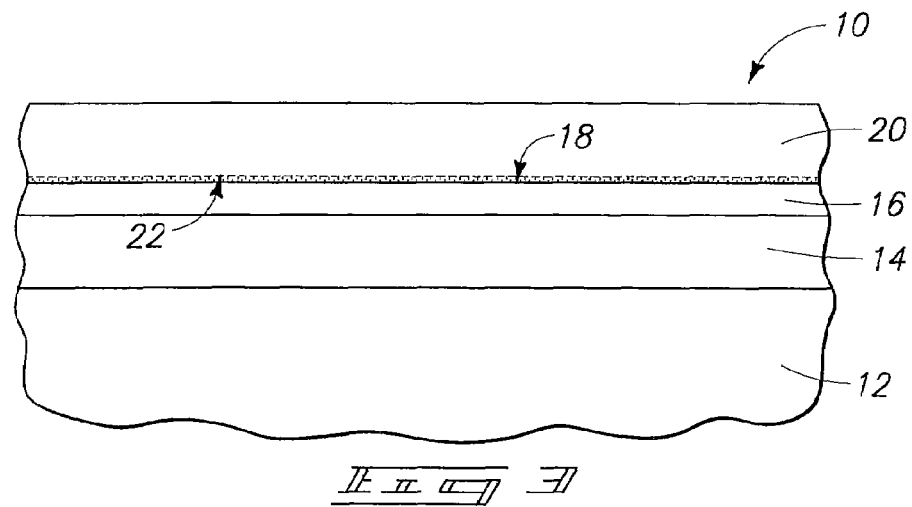
FIG. 3 is a view of the FIG. 1 fragment at a processing step subsequent to that shown by FIG. 2.

Referring to FIG. 3, a second capacitor electrode 20 is deposited over treated oxide containing surface 18. Exemplary preferred materials include semiconductive materials and metal. Regardless, second capacitor electrode 20 comprises an inner metal surface 22 which is contacting against treated oxide containing surface 18. In one preferred embodiment, second capacitor electrode 20 consists essentially of metal. Regardless, in one preferred embodiment inner metal surface 22 comprises an elemental metal or an alloy of elemental metals, and in another preferred embodiment comprises a conductive metal compound. Preferred exemplary materials are the same as those described above for first capacitor electrode 14, with tungsten and titanium nitride being specific preferred examples. Further, preferably all of inner surface 22 comprises metal. In one preferred embodiment, an MIS capacitor is formed and in another preferred embodiment an MIM capacitor is formed.

Figure 4:
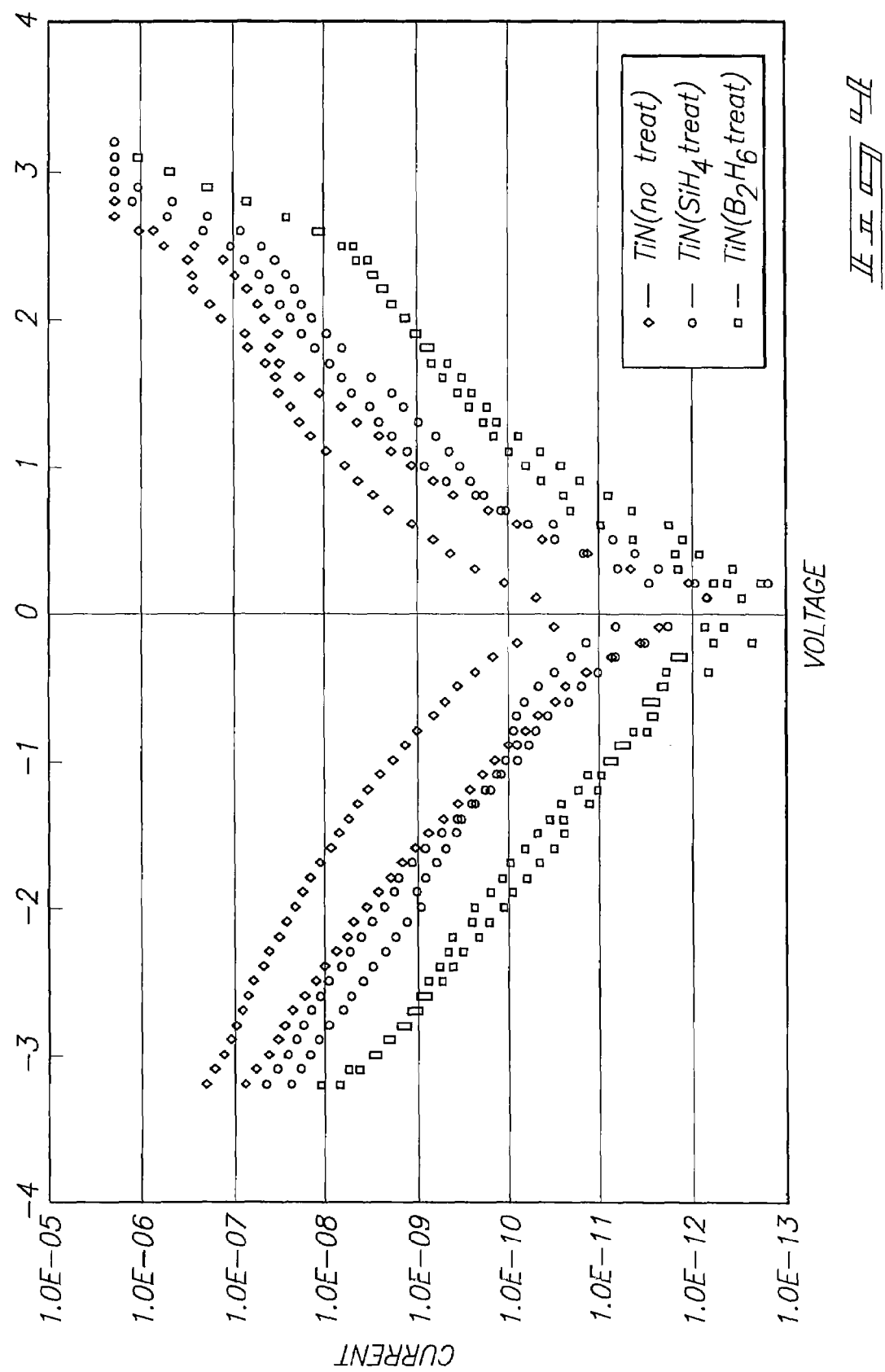
FIG. 4 is a graph of current vs. voltage for certain capacitors of a common construction.

The above-described treating can provide certain advantages or results. In one exemplary preferred embodiment, the treating has been found to be effective to reduce the leakage current of the capacitor than would otherwise occur in the absence of such treating. By way of example only, FIG. 4 depicts a plot of current versus voltage for several identical capacitor constructions wherein the outer or second capacitor electrode was formed by chemical vapor deposition (CVD) of titanium nitride. Current versus voltage profile for control (no treat) examples as well as treated with $SiH_4$ or $B_2H_6$ examples are shown. As is apparent, leakage current across such capacitors is lower for a given voltage for the treated versus untreated constructions. Depletion might also be reduced.

In another preferred and exemplary implementation, such treating can be effective to reduce halogen incorporation into the capacitor dielectric region than would otherwise occur in the absence of such treating and, where the depositing of the second capacitor electrode comprises the use of a halogen containing gas. For example, and by way of example only, titanium nitride can be deposited by CVD utilizing $TiCl_4$ and ammonia by continuous or pulsed CVD. By way of example only, an exemplary pulsed CVD process includes a substrate temperature from 400° C. to 600° C. and a deposition pressure from 1 Torr to 5 Torr. $TiCl_4$ can be fed at an exemplary rate from 100 mg per minute to 500 mg per minute anywhere from 100 ms to 10 seconds, followed by ammonia pulsed flow at, for example, from 100 sccm to 5000 sccm from 100 ms to 10 seconds. Intervening reactor purge with an inert gas and/or pump down might be included intermediate the $TiCl_4$ and $NH_3$ flowings. In the absence of treating in accordance with the invention, utilizing such process can result in significant incorporation of chlorine into the deposited layer. For example, the resulting film might constitute 5% chlorine. Further and regardless, it can be difficult utilizing halide precursors to deposit metal on oxide surface dielectrics. Treating the exposed oxide containing surface as described above in accordance with an aspect of the invention has been found to be effective to reduce halogen incorporation into the capacitor dielectric region than otherwise occurs in the absence of such treating.

Further, the inventive treating has been discovered to provide an advantage or improved result in other aspects. For example, it has previously been discovered to be at least highly preferred to deposit outer metal capacitor electrodes over aluminum oxide surface capacitor dielectrics within twenty-four hours of the aluminum oxide deposition. Waiting more than twenty-four hours can result in significant water incorporation in the form of pending OH groups on the outer aluminum oxide surface. This can be highly undesirable and problematic in the deposition of a subsequent metal capacitor electrode thereover. However, treating such surfaces in accordance with the above-described embodiments after the elapse of the twenty-four period has been found to eliminate the problem, thereby enabling better films to be deposited after twenty-four hours than was possible previously. Apparently, such treatment has the effect of passivating such OH groups either by removing them or eliminating their deleterious effects on subsequently deposited metal second capacitor electrodes. An aspect of the invention contemplates treating of the exposed oxide containing surface effective to so passivate OH groups which are there-present.

The invention also contemplates treating the capacitor dielectric region during its formation with at least one of a borane or a silane. For example, capacitor dielectric region 16 can be formed by the deposition of multiple dielectric layers, for example of the same dielectric material or comprised of at least two different dielectric materials. In accordance with an aspect of the invention, intermediate at least some of the dielectric layer depositions, an outer surface of the capacitor dielectric region being formed at that point in the process is treated with at least one of a borane or a silane. Preferred treatment attributes with respect to such are as described above. By way of example only and not by way of limitation, such might result in boron and/or silicon incorporation into the capacitor dielectric region in addition to sorbing to the outer surface thereof. By way of example only and not by way of limitation, such might favorably impact the degree of leakage current or provide material to react with halogen to minimize its incorporation into the resulting films or layers when halogen containing gases are used.

An alternate or additional implementation in a method of forming a capacitor in accordance with an aspect of the invention is described with reference to FIGS. 5-7. Referring initially to FIG. 5, a substrate fragment 30 comprises a semiconductor substrate 32. A first capacitor electrode 34 is formed over semiconductor substrate 32. Such comprises an exposed metal surface 36, for example as described and having the attributes of inner surface 22 of the above first exemplary embodiment. In one preferred embodiment, first capacitor electrode 34 consists essentially of metal. However, composites of conductive and semiconductive materials are contemplated as long as least some portion of surface 36 comprises an exposed metal surface. Exemplary preferred materials for first capacitor electrode 34 are as otherwise described above with respect to the first described embodiment first capacitor electrode 14.

Referring to FIG. 6, exposed metal surface 36 of first capacitor electrode 34 is treated with at least one of a borane or a silane. The exemplary and preferred treating aspects are as described above in the first described embodiment with respect to capacitor dielectric region 16. Further for example as described above, such treating might not deposit any layer over outer surface 36 and, if any layer is deposited, such is preferably no more than three monolayers thick.

Referring to FIG. 7, a capacitor dielectric region 38 is formed onto first capacitor electrode 34. Capacitor dielectric region 38 comprises an oxide containing surface 40 received contacting against treated metal surface 36 of first capacitor electrode 34. The capacitor dielectric region might comprise multiple different dielectric materials and/or layers as long as some portion of surface 40 constitutes an oxide containing surface.

A second capacitor electrode 42 is formed over capacitor dielectric region 38. Such might comprise a composite of conductive metal and/or semiconductive materials and/or layers. In one exemplary preferred embodiment, the second capacitor electrode consists essentially of metal. In another exemplary preferred embodiment, the second capacitor electrode consists essentially of semiconductive material, for example conductively doped polysilicon. In one preferred embodiment, an SIM capacitor is formed and in another preferred embodiment an MIM capacitor is formed.

The first described attributes of the invention might be combined with the second described attributes. Further and regardless, during its formation and if in multiple dielectric layers, the capacitor dielectric region could be treated with at least one of a borane or a silane as described above.

Results and/or advantages as described above can occur with respect to the second described aspect of the invention. Further, yet-to-be discovered results and advantages may develop from such treating. In one exemplary aspect, the treating is effective to reduce halogen incorporation into the capacitor dielectric region than would otherwise occur in the absence of such treating where the forming the capacitor dielectric region comprises using a halogen containing gas.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a capacitor, comprising:
   forming a first capacitor electrode over a semiconductor substrate, the first capacitor electrode comprising an exposed metal surface;
   treating the exposed metal surface of the first capacitor electrode with at least one of a borane or a silane without depositing any layer onto the exposed metal surface during any of said treating;
   after said treating with at least one of the borane or the silane without depositing any layer onto the exposed metal surface during any of said treating, then forming a capacitor dielectric region onto the first capacitor electrode, the capacitor dielectric region comprising an oxide-containing surface received contacting against the treated metal surface of the first capacitor electrode; and
   forming a second capacitor electrode over the capacitor dielectric region.

2. The method of claim 1 wherein the first capacitor electrode consists essentially of metal.

3. The method of claim 1 wherein the treating is with at least one borane.

4. The method of claim 3 wherein all borane used during the treating is void of halogen.

5. The method of claim 1 wherein the treating is with at least one silane.

6. The method of claim 5 wherein all silane used during the treating is void of halogen.

7. The method of claim 1 wherein the exposed metal surface comprises an elemental metal or an alloy of elemental metals.

8. The method of claim 1 wherein the exposed metal surface comprises a conductive metal compound.

9. The method of claim 1 wherein the second capacitor electrode consists essentially of metal.

10. The method of claim 1 wherein the second capacitor electrode consists essentially of semiconductive material.

11. The method of claim 1 wherein forming the capacitor dielectric region comprises using a halogen-containing gas.

12. The method of claim 1 wherein,
   forming the capacitor dielectric region comprises deposition of multiple dielectric layers; and intermediate at least some of the dielectric layer depositions, treating an outer surface of the capacitor dielectric region being formed with at least one of a borane or a silane.

13. The method of claim 1 wherein the first capacitor electrode consists essentially of metal and the second capacitor electrode consists essentially of semiconductive material thereby forming an SIM capacitor.

14. The method of claim 1 wherein the first capacitor electrode consists essentially of metal and the second capacitor electrode consists essentially of metal thereby forming an MIM capacitor.

15. A method of forming a capacitor, comprising:
forming a first capacitor electrode consisting essentially of metal over a semiconductor substrate, the first capacitor electrode comprising an exposed metal surface;
treating the exposed metal surface of the first capacitor electrode with at least one of a borane or a silane at a temperature from 200° C. to 500° C. and a pressure from 1 Torr to 100 Torr for at least 1 second, the treating being void of depositing any layer onto the exposed metal surface during any of said treating;
after said treating with at least one of the borane or the silane without depositing any layer onto the exposed metal surface during any of said treating, then forming a capacitor dielectric region onto the first capacitor electrode, the capacitor dielectric region comprising an oxide-containing surface received contacting against the treated metal surface of the first capacitor electrode; and
forming a second capacitor electrode over the capacitor dielectric region.

16. The method of claim 15 wherein the treating is with at least one borane.

17. The method of claim 16 wherein all borane used during the treating is void of halogen.

18. The method of claim 15 wherein the treating is with at least one silane.

19. The method of claim 18 wherein all silane used during the treating is void of halogen.

20. The method of claim 1 wherein the treating is with at least one borane and with at least one silane.

21. The method of claim 15 wherein the treating is with at least one borane and with at least one silane.

22. A method of forming a capacitor, comprising:
forming a first capacitor electrode over a semiconductor substrate, the first capacitor electrode comprising an exposed metal surface;
treating the exposed metal surface of the first capacitor electrode with at least one borane and with at least one silane;
forming a capacitor dielectric region onto the first capacitor electrode, the capacitor dielectric region comprising an oxide-containing surface received contacting against the treated metal surface of the first capacitor electrode; and
forming a second capacitor electrode over the capacitor dielectric region.

23. The method of claim 22 wherein the oxide-containing surface comprises hafnium oxide.

24. The method of claim 22 wherein the oxide-containing surface comprises aluminum oxide.

* * * * *